United States Patent [19]
Lee et al.

[11] Patent Number: 5,821,157
[45] Date of Patent: Oct. 13, 1998

[54] ARGON AMORPHIZING POLYSILICON LAYER FABRICATION

[75] Inventors: Joo-hyung Lee; Jae-jong Han, both of Seoul, Rep. of Korea

[73] Assignee: Samsung Electronics Co., Ltd., Suwon, Rep. of Korea

[21] Appl. No.: 632,840

[22] Filed: Apr. 16, 1996

[30] Foreign Application Priority Data

Apr. 17, 1995 [KR] Rep. of Korea .................. 95-8995

[51] Int. Cl.⁶ .................................................. H01L 21/265
[52] U.S. Cl. ..................... 438/514; 438/517; 438/798; 438/799; 427/523; 427/387
[58] Field of Search ................... 427/523, 387; 437/20, 24, 247; 438/514, 517, 798, 799

[56] References Cited

U.S. PATENT DOCUMENTS 5,436,175  7/1995  Nakato et al. .......................... 437/24
5,580,815  12/1996  Hsu et al. ............................ 438/362

*Primary Examiner*—Mark Chapman
*Attorney, Agent, or Firm*—Myers Bigel Sibley & Sajovec

[57] ABSTRACT

A polycrystalline silicon (polysilicon) layer is fabricated by forming a polysilicon layer on a substrate, implanting argon into the polysilicon layer to selectively amorphize the polysilicon layer and recrystallizing the selectively amorphized polysilicon layer. The argon dosage and energy may be controlled so that the argon passes through the polysilicon layer into the substrate so that argon ions do not disturb recrystallization. By using argon amorphizing, excessive heating of the substrate during implantation is prevented and ion implanter contamination from conventional silicon implantation is prevented.

11 Claims, 4 Drawing Sheets

ARGON AMORPHIZING POLYSILICON LAYER FABRICATION

FIELD OF THE INVENTION

This invention relates to microelectronic devices and manufacturing methods and more particularly to polycrystalline silicon (polysilicon) layers and manufacturing methods.

BACKGROUND OF THE INVENTION

Polycrystalline silicon (referred to herein as polysilicon) in thin film form has many important applications in microelectronic technology. For example, thin film transistors (TFT) may be formed in a polysilicon layer for liquid crystal displays (LCD).

One conventional fabrication method for a polysilicon layer is the solid phase crystallization (SPC) method, which is illustrated in FIGS. 1A–1C. As shown in FIGS. 1A and 1B, an amorphous silicon layer 104 is formed on a substrate 102 by chemical vapor deposition, physical vapor deposition or other techniques. Then, as shown in FIG. 1C, a first anneal is performed at relatively low temperatures of about 500°–700° C. to increase the grain size of the amorphous silicon layer 104. A second annealing process is performed at relatively high temperatures of about 800°–1100° C. to decrease the density of trap states and improve the characteristics of the crystallized polysilicon layer 106.

Unfortunately, the first anneal of the SPC method may require inordinately long times. The polysilicon which is produced by the SPC method may also have undesirably low carrier mobilities of about 30 $cm^2/V \cdot s$.

Another conventional method of fabricating a polysilicon layer is the seed selection through ion channeling (SSIC) method. FIGS. 2A–2D illustrate the SSIC method. As shown in FIG. 2A, a polysilicon layer 306 is formed on a substrate 302. As shown in FIG. 2B, silicon ions 307 are implanted into the polysilicon layer 306. During this silicon ion implantation, a channeling effect occurs. The parts of the polysilicon layer 306 in which channeling effects do not occur are amorphized to produce a selectively amorphized polysilicon layer 308, illustrated in FIG. 2C. Then, as illustrated in FIG. 2D, the part of the polysilicon layer 308 which is not amorphized acts as a seeding area for recrystallization during a low temperature annealing process in which the polysilicon grain size increases to form polysilicon layer 310.

Using the SSIC fabrication method, high quality polysilicon layers may be produced having carrier mobilities of 100 $cm^2/V \cdot s$ or more. Unfortunately, the SSIC method may require silicon ion implantation at dosages of $1 \times 10^{15}/cm^2$ or more, which may increase the temperature of the substrate 302 during implantation. This high substrate temperature may prevent the amorphized polysilicon layer from recrystallizing. Accordingly, additional cooling for the substrate, such as liquid nitrogen cooling, may be required in the ion implanter, which may increase the cost and complexity of the ion implanter. Moreover, a gas such as $SiF_6$ is often used to implant silicon ions. This gas often leaves a powdered residue in the ion implanter which may shorten the life of the implanter or require increased periodic maintenance.

SUMMARY OF THE INVENTION

It is therefore an object of the present invention to provide improved methods of fabricating a polysilicon layer on a substrate.

It is another object of the invention to provide polysilicon layer manufacturing methods which do not require liquid nitrogen cooling of a substrate during implantation.

It is yet a further object of the present invention to provide a polysilicon layer fabrication method which does not unduly degrade the ion implanter which is used.

It is still another object of the invention to provide high carrier mobility polycrystalline silicon layer for microelectronic devices.

These and other objects are provided according to the invention by a polysilicon layer fabrication method which forms a polysilicon layer on a substrate, implants argon into the polysilicon layer to selectively amorphize the polysilicon layer, and recrystallizes the selectively amorphized polysilicon layer. By implanting argon into the polysilicon layer, implantation can be obtained without requiring liquid nitrogen or other exotic cooling of the substrate during implantation. Moreover, by avoiding the use of $SiF_6$, powdered residue in the ion implanter is reduced or eliminated. Low dosages of argon may be used while still producing a high quality polysilicon layer with high carrier mobility.

In a preferred embodiment of the present invention, ions, and more particularly argon ions, are implanted from outside the polysilicon layer through the polysilicon layer and into the substrate to selectively amorphize the polysilicon layer. The argon ions preferably come to rest adjacent the substrate face which is opposite the polysilicon layer. Preferably, the polysilicon layer remains free of argon, so that its performance is not degraded. Argon may be implanted at an energy of 80 KeV and at a dose between $3 \times 10^{14}/cm^2$ and $8 \times 10^{14}/cm^2$. Recrystallizing preferably occurs by annealing the selectively amorphized polysilicon layer at temperatures of 650° C. or less.

A polysilicon microelectronic device according to the present invention includes a substrate having argon therein and a polysilicon layer on the substrate. The polysilicon layer is preferably a recrystallized polysilicon layer, and the argon preferably is in the substrate opposite the polysilicon layer. In particular, the substrate includes a first face adjacent the polysilicon layer and a second face opposite the polysilicon layer, and the argon is preferably in the substrate adjacent the second face. A high quality polysilicon layer, for thin film transistor liquid crystal displays and other microelectronic applications, is thereby provided.

DETAILED DESCRIPTION OF PREFERRED EMBODIMENTS

Figure 1A:
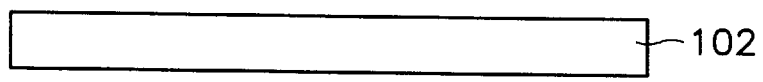
FIGS. 1A–1C are cross-sectional views of a polysilicon layer which is fabricated by a conventional solid phase crystallization (SPC) method, during intermediate fabrication steps.
Figure 1B:
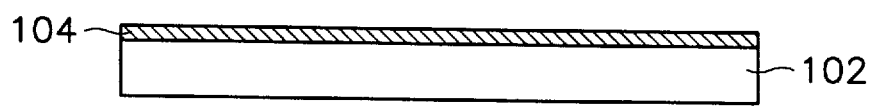
Figure 1C:
Figure 2A:
FIGS. 2A–2D are cross-sectional views of a polysilicon layer which is fabricated by a conventional seed selection through ion channeling (SSIC) method, during intermediate fabrication steps.
Figure 2B:
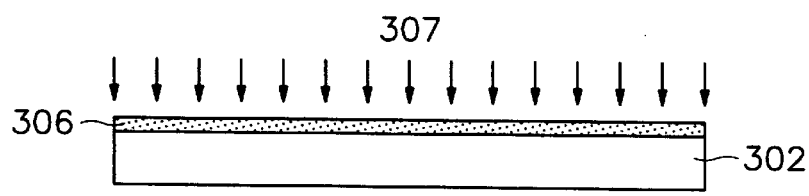
Figure 2C:
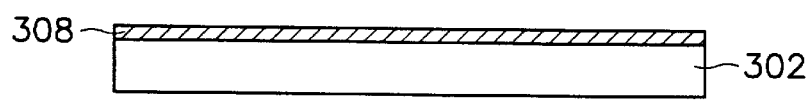
Figure 2D:
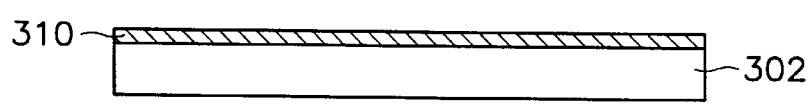

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3A:
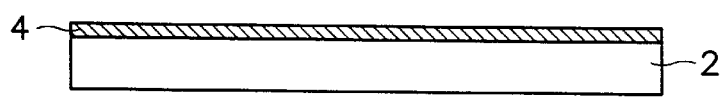
FIGS. 3A–3D are cross-sectional views of a polysilicon layer which is fabricated according to the present invention.

FIGS. 3A–3D are cross-sectional views of a polysilicon layer which is fabricated according to the present invention. As shown in FIG. 3A, a polysilicon layer 4 is formed on a substrate 2 using deposition or other conventional techniques. It will be understood that as used herein, the term "on" refers to formation directly on an underlying element, or with intervening elements therebetween.

Figure 3B:
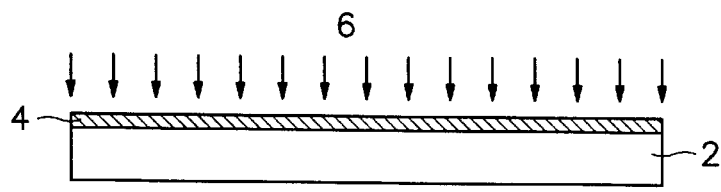
Figure 3C:
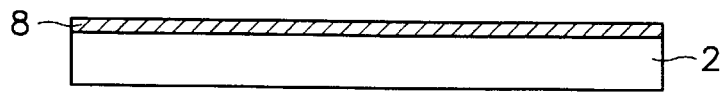

As shown in FIG. 3B, argon ions 6 are implanted in the polysilicon layer 4 to selectively amorphize the polysilicon layer 4. Preferably, as described below, the dose and energy of the implanted argon ions are selected so that they are implanted from outside the polysilicon layer 4 through the polysilicon layer 4 and into substrate 2 without significant quantities of argon remaining in the polysilicon layer 4 after implantation. Preferably, the argon ions come to rest adjacent the bottom face of substrate 2 opposite polysilicon layer 4. Accordingly, the argon energy is preferably adjusted to have a projected ion range to the lower part of the substrate, to thereby prevent the argon ions from remaining in the polysilicon layer and disturbing crystal growth. FIG. 3C illustrates the selectively amorphized polysilicon layer 8. Finally, as shown in FIG. 3D, the selectively amorphized polysilicon layer 8 is recrystallized to form a recrystallized polysilicon layer 10, preferably by annealing.

Polysilicon layer fabrication methods according to the present invention will now be described in greater detail. Referring again to FIG. 3A, polysilicon layer 4 is preferably deposited on substrate 2, at temperatures of 580° C. or more. When the temperature is 580° C. or more, the polysilicon layer can be recrystallized in the <100> direction.

Figure 4:
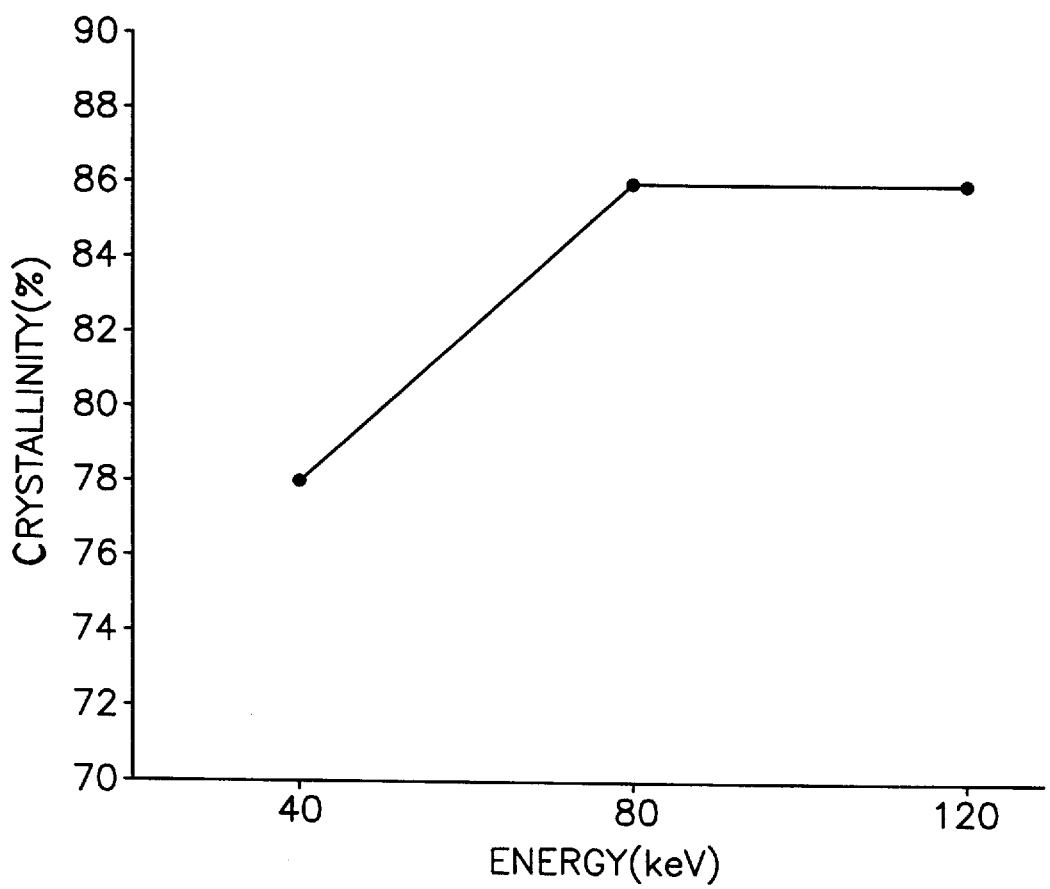
FIG. 4 graphically illustrates crystallinity as a function of ion implantation energy for argon ions.
Figure 5:
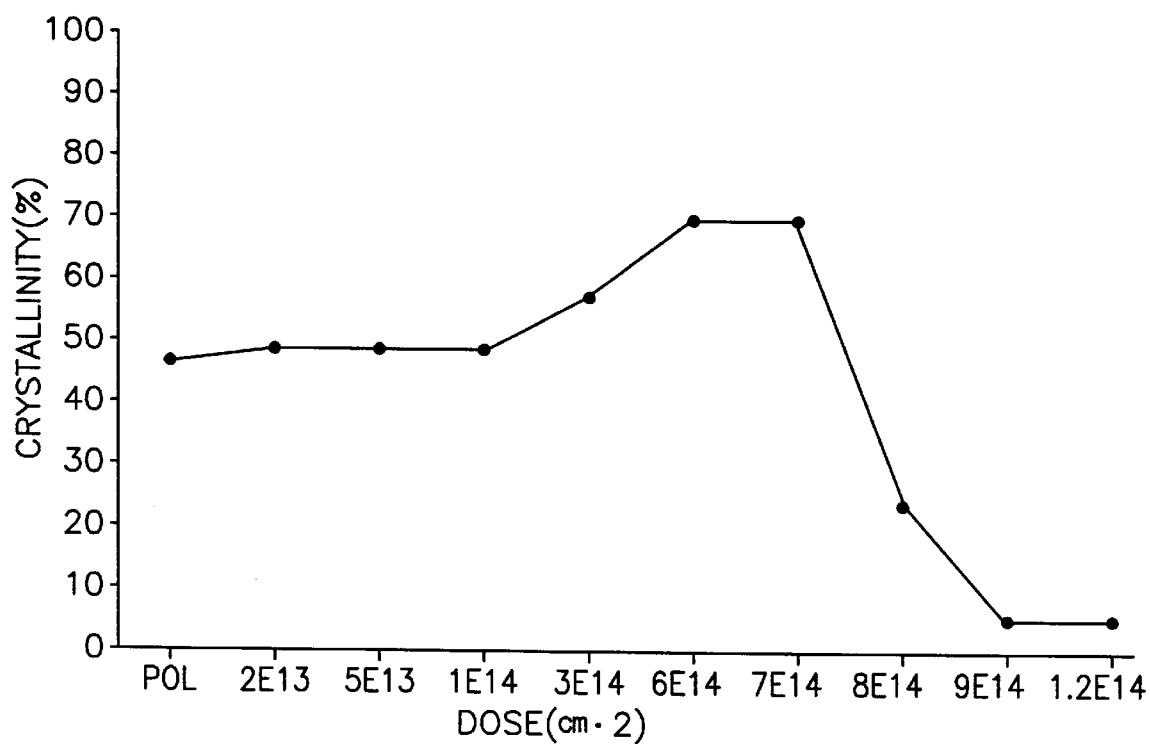
FIG. 5 graphically illustrates crystallinity as a function of ion dose for argon ions.

Referring again to FIGS. 3B and 3C, argon ions 6 are implanted in the polysilicon layer 4 to selectively amorphize the polysilicon layer 4. In general, the portions of the polysilicon layer which do not have a crystalline <100> structure are amorphized. As shown in FIG. 4, argon ion energies of 80 KeV are preferred in order to have a projected ion range ($R_p$) in the lower part of the substrate 2, opposite the polysilicon layer 4. In addition, as graphically illustrated in FIG. 5, an argon ion dosage of $1 \times 10^{14}/cm^2$ or more is preferable. Most preferably, argon ion dosage ranges from $3 \times 10^{14}/cm^2$ to $8 \times 10^{14}/cm^2$ are used.

Figure 3D:
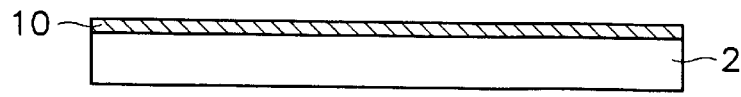

Finally, as shown in FIG. 3D, the selectively amorphized polysilicon layer 8 is recrystallized to form polysilicon layer 10. Recrystallization is preferably performed by annealing at a temperature of 650° C. or less. During this anneal, crystal seeds with <100> crystalline direction are formed in the amorphized portions of the polysilicon layer. These seeds grow and transform the amorphized portions of the polysilicon into crystalline polysilicon with a <100> orientation.

Polysilicon layer 10 may be further processed to form a thin film transistor-liquid crystal display (TFT-LCD) using conventional manufacturing techniques. The polysilicon layer 10 may also be used for other microelectronic devices. In such devices, the polysilicon layer 10 need not be formed directly on the substrate 2, but may be formed on the substrate 2 with other intervening layers between the polysilicon layer 10 and the substrate 2.

Since only small quantities of argon may be necessary to selectively amorphize the polysilicon layer, a high quality polysilicon layer is provided. Moreover, argon implantation may be performed without significantly increasing the substrate temperature, so that conventional water cooled ion implanters may be used and liquid nitrogen cooling is not required. Powdered $SiF_6$ residue is also not produced, so that reduced maintenance of the ion implanter and longer implanter life may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A microelectronic layer fabrication method, comprising the steps of:

forming a polysilicon layer on a substrate;

implanting argon into the polysilicon layer to selectively amorphize the polysilicon layer; and recrystallizing the selectively amorphized polysilcon layer to form a recrystallized polysilicon layer.

2. A method according to claim 1 wherein said recrystallizing step comprises the step of annealing the selectively amorphized polysilicon layer.

3. A method according to claim 1 wherein said implanting step comprises the step of implanting argon through the polysilicon layer and into the substrate.

4. A method according to claim 3 wherein said implanting step comprises the step of implanting argon at energy which is sufficiently high to implant the argon through the polysilicon layer and into the substrate.

5. A method according to claim 1 wherein said implanting step comprises the step of implanting argon into the polysilicon layer at energy of 80 KeV.

6. A method according to claim 1 wherein said implanting step comprises the step of implanting argon into the polysilicon layer at a dose from $3 \times 10^{14}/cm^2$ to $8 \times 10^{14}/cm^2$.

7. A method according to claim 2 wherein said annealing step comprises the step of annealing the polysilicon layer at temperatures of 650° C. or less.

8. A microelectronic layer fabrication method, comprising the steps of:

forming a polysilicon layer on a substrate;

implanting ions from outside the polysilicon layer through the polysilicon layer and into the substrate, to selectively amorphize the polysilicon layer; and recrystallizing the selectively amorphized polysilicon layer to form a recrystallized polysilicon layer.

9. A method according to claim 8 wherein said implanting step comprises the step of implanting argon ions from outside the polysilicon layer through the polysilicon layer and into the substrate, to selectively amorphize the polysilicon layer.

10. A method according to claim 8 wherein said recrystallizing step comprises the step of annealing the selectively amorphized polysilicon layer.

11. A method according to claim 10 wherein said annealing step comprises the step of annealing the polysilicon layer at temperatures of 650° C. or less.

* * * * *